US009574865B2

United States Patent
Pfaffinger et al.

(10) Patent No.: US 9,574,865 B2
(45) Date of Patent: Feb. 21, 2017

(54) METHOD AND APPARATUS FOR SENSING MAGNETIC FIELDS

(75) Inventors: Christian Pfaffinger, Ruhstorf a. d. Rott (DE); Johann Hofer, Ortenburg (DE); Felix Mednikov, Ortenburg (DE); Thomas Wisspeintner, Ortenburg (DE); Guenter Schallmoser, Ruhstorf a. d. Rott (DE)

(73) Assignee: MICRO-EPSILON Messtechnik GmbH & Co. KG, Ortenburg (DE)

( * ) Notice: Subject to any disclaimer, the term of this patent is extended or adjusted under 35 U.S.C. 154(b) by 423 days.

(21) Appl. No.: 13/817,049

(22) PCT Filed: Aug. 12, 2011

(86) PCT No.: PCT/DE2011/001590
§ 371 (c)(1),
(2), (4) Date: Feb. 14, 2013

(87) PCT Pub. No.: WO2012/022300
PCT Pub. Date: Feb. 23, 2012

(65) Prior Publication Data
US 2013/0141081 A1    Jun. 6, 2013

(30) Foreign Application Priority Data

Aug. 14, 2010  (DE) .......................... 10 2010 034 327

(51) Int. Cl.
*G01B 7/14*      (2006.01)
*G01D 5/14*      (2006.01)
*G01R 33/12*     (2006.01)

(52) U.S. Cl.
CPC ........ *G01B 7/14* (2013.01); *G01D 5/14* (2013.01); *G01R 33/1223* (2013.01)

(58) Field of Classification Search
CPC ........................................................ G01B 7/14
(Continued)

(56) References Cited

U.S. PATENT DOCUMENTS

| 5,583,333 A | 12/1996 | Hoshino et al. |
| 5,801,630 A | 9/1998 | Ho et al. |

(Continued)

FOREIGN PATENT DOCUMENTS

| DE | 19621886 A1 | 12/1997 |
| DE | 60003067 T2 | 4/2004 |

(Continued)

OTHER PUBLICATIONS

International Searching Authority, International Search Report for International Application No. PCT/DE2011/001590, 15 pages, European Patent Office, The Netherlands.
(Continued)

*Primary Examiner* — Bot Ledynh
(74) *Attorney, Agent, or Firm* — Alston & Bird LLP

(57) ABSTRACT

A method for detecting magnetic fields, particularly for detecting the position of objects with a preferably oblong, soft-magnetic element, which is connected to electronics, with via the electronics the impedance of the soft-magnetic material is measured, characterized in that a magnetic field is used in which by the position of an object which is located in an arrangement with the soft-magnetic material the magnetic field develops at the location of the soft-magnetic material, with the magnetic permeability μ of the soft-magnetic material adjusting, depending on the magnetic field and thus the position of the object. A respective device serves for applying the method according to the invention.

28 Claims, 11 Drawing Sheets

(58) Field of Classification Search
USPC .................................................. 324/207.24
See application file for complete search history.

(56) References Cited

U.S. PATENT DOCUMENTS

| | | | |
|---|---|---|---|
| 6,622,913 B1 | 9/2003 | Antonenco et al. | |
| 2005/0242955 A1 | 11/2005 | Lian et al. | |
| 2008/0013212 A1* | 1/2008 | Fuse et al. | 360/131 |
| 2008/0164868 A1 | 7/2008 | Servel | |

FOREIGN PATENT DOCUMENTS

| | | |
|---|---|---|
| DE | 102007062862 A1 | 7/2008 |
| EP | 0763832 A1 | 3/1997 |
| EP | 0989411 A2 | 3/2000 |
| EP | 1438921 A1 | 7/2004 |
| EP | 1770361 A2 | 4/2007 |

OTHER PUBLICATIONS

International Searching Authority, Written Opinion for International Application No. PCT/DE2011/001590, 14 pages, European Patent Office, Germany.

Valenzuela, R., et al., "A Position Sensor Based on Magnetoimpedance," *Journal of Applied Physics*, Apr. 15, 1996, pp. 6549-6551, vol. 79, No. 8, American Institute of Physics, USA.

Phan, Manh-Huong, et al, "Giant Magnetoimpedance Materials: Fundamentals and Applications," *Progress in Materials Science*, Feb. 1, 2008, pp. 323-420, vol. 53, Elsevier, The Netherlands, Accessed on Feb. 8, 2013, Retrieved from <http://shell.cas.usf.edu/~phanm/PMS.pdf>.

* cited by examiner

METHOD AND APPARATUS FOR SENSING MAGNETIC FIELDS

CROSS REFERENCE TO RELATED APPLICATIONS

This application is a National Stage application, filed under 35 U.S.C. §371, of International Application PCT/DE2011/001590, filed Aug. 12, 2011, which claims priority to German Application No. 10 2010 034 327.7, filed Aug. 14, 2010, both of which are hereby incorporated by reference in their entirety.

BACKGROUND

1. Technical Field

The invention relates to a method and a device for detecting magnetic fields, particularly for detecting the position of objects. Concretely, the invention relates to a method for detecting magnetic fields, particularly for detecting the position of objects, with a preferably oblong, soft-magnetic element, which is connected to electronics, with the impedance of the soft-magnetic material being measured via electronics. Furthermore, the invention relates to a device for detecting magnetic fields, particularly for detecting the position of objects, with a preferably oblong, soft-magnetic material, which is connected to electronics, with by the electronics the impedance (quality) of the soft-magnetic material being determined/measured, particularly for applying the method according to the invention.

Tasks for measuring positions need to be solved in numerous applications. In automation technology it is necessary to detect the position of objects in the processing sequence or to monitor moving machine parts. In the automotive field, particularly in motor vehicles, a plurality of movements and positions are monitored in or at the motor, the clutch, the transmission, body parts, etc. Similar applications also exist in the field of aeronautics, where in airplanes the position of flaps, doors, or landing gear is to be detected. Additionally, in the consumer field, e.g., in washing machines, the weight of the textiles is weighed via a position measurement.

2. Description of Related Art

Numerous solutions for these position measurement tasks have been described in literature, which operate with different physical measuring methods, such as sensitive, capacitive, inductive, optic, or also magnetic measuring methods. A particular class of such measuring methods includes magnetic methods, because here usually a magnet is fastened at the object to be measured (measuring object). Here, sensors represent a variant, in which the magnet is allocated to the sensor and the reaction of the measuring object is detected. Here, the measuring object must show magnetic features, though, particularly ferromagnetic features. These sensors have in common that the position of the measuring object is detected by a magnetic reaction, which is detected by a sensor. Here, magnetic sensors are particularly suitable at places where the movement of mobile objects through fixed bodies must be detected. By the extension of magnetic fields through non-magnetic materials, for example the position of pistons within cylinders can be measured, if it comprises a non-magnetic material, for example aluminum.

Such position sensors with magnetic measuring principles have been known for quite some time.

There are several different methods and materials, which can be used for measuring the relative position of a sensor in reference to a measuring object with an integrated magnet (permanent magnet and electromagnet).

Typical examples include Hall-sensors, magneto-resistive sensors (AMR, GMR, XMR), flux-gate sensors.

From DE 196 21 886 A1 a magnetic position measuring device is known to determine the relative position of two objects mobile in reference to each other using at least one flux-gate sensor for scanning a periodically magnetized measuring division with the division period, with the flux-gate sensor comprising at least one exciter coil and at least two sensor coils arranged around a soft-magnetic carrier body, arranged at certain distances from each other.

For large measuring ranges several flux-gate sensors with a linear carrier body are arranged parallel in reference to each other and produced in thin-film technology.

An interpolation unit is also provided, which operates according to the principle of amplitude evaluation of carrier-frequency signals.

From DE 10 2007 062 862 A1 a method is known for determining the position of a measuring object in reference to a sensor, with the sensor comprising a sensor coil impinged with alternating current, in which the permeability of a soft-magnetic material changes under the influence of a magnetic field. The magnetic field is generated by a permanent magnet allocated to the measuring object.

Reference is made to additional magnetic sensors according to prior art described in DE 10 2007 062 862 A1.

The sensors of prior art show disadvantages, though:

Flux-gate sensors used according to DE 196 21 886 A1 include an exciter and two receiver coils, with the magnetization of a soft-magnetic core being measured. The sensor according to DE 10 2007 062 862 A1 also includes a coil supplied with alternating current. Coils are relatively expensive components, because they are difficult to wind or, in case of coils printed or etched on circuit boards, set high demands to the precision of the printing or etching process. Another disadvantage of such sensors is the fact that coils or magnetic cores represent relatively large-volume parts. Thus, it is not possible with these principles to produce small, compact sensors which can also be used in restricted construction spaces.

Another disadvantage of the sensors of prior art is the fact that they measure primarily the strength of the magnetic field H. For example, in Hall-sensors of prior art there is a direct linear connection between the measuring signal, namely the Hall-voltage $U_H$ and the magnetic field H. Even in the magneto-resistive sensors the primary measuring signal is proportional to the magnetic field H. Thus, the magnetic field can be measured very well with these types of sensors. A serious disadvantage is given here, though, in that the magnetic field of a permanent magnet or an electromagnet is not reducing linearly with increasing distance from the magnet but shows an extremely non-linear (frequently exponentially) reducing parameter, which is known per se. Thus, any sensor comprising a linear parameter with regards to the magnetic field H is suitable to a limited extent only for detecting the position of a measuring object comprising a magnet. In technology it is particularly advantageous to obtain a signal which is linearly dependent on the desired size, in this case the position or the distance of a measuring object, because then any expensive linearization or calibration can be omitted. In order to obtain an approximately linear signal in spite of non-linear parameters frequently the measuring range is limited so that from the non-linear parameter only a small segment is utilized, in a first approximation sectionally linear. However, this method drastically restricts the measuring range available.

BRIEF SUMMARY

The present invention is based on the objective to provide a simply-designed, cost-effective, and compact sensor with a large measuring range and high resolution for the measurement of magnetic fields, by which the position of objects can be measured in reference to the sensor. Ultimately, in general a device shall be provided to detect magnetic fields comprising the respective features. Additionally, a respective method shall be provided for detecting magnetic fields, which uses the device according to the invention.

The above-stated objective is attained in the features of the parallel claims 1 and 12.

The method according to the invention is characterized in that a magnetic field is used, according to which the magnetic field adjusts at the location of the soft-magnetic material by the position of an object located in an arrangement in reference to the soft-magnetic material, by which the magnetic permeability t of the soft-magnetic material adjusts depending on the magnetic field and thus the position of the object.

The device according to the invention attains the above-stated objective such that a magnetic field is used, with by the position of a measuring object located in an arrangement in reference to the soft-magnetic material the magnetic field adjusts at the location of the soft-magnetic material, with the permeability changing/resulting depending on the magnetic field and thus depending on the position and with the permeability changing the measurable impedance resulting therefrom.

In the following, the method according to the invention and the device according to the invention are discussed similarly, namely with reference to the features essential for the invention.

The soft-magnetic material that can be used for the novel sensor principle may comprise an amorphous, nano-crystalline, or crystalline structure and is available in form of bands or as micro-wires with and without glass insulation. By particular material compositions various fundamental features can be realized Magneto-striction and magneto-elastic effects
GMI (Giant magneto impedance)
Magnetic resonance Such soft-magnetic materials are used in various applications, such as in anti-theft devices, in pressure sensors, force sensors, path sensors, particularly based on magneto-striction, etc.

There are various methods for producing amorphous or nano-crystalline micro-wires. For example, in the Taylor-Ulitovski process the micro-wire is directly drawn from the melt. An important feature of this process is the fact that from pure metal and alloys cost-effective micro-wires can be produced in a process with diameters of approx. 1 µm to 40 µm and glass insulation.

In principle, all soft-magnetic materials show a dependency of the magnetic permeability from the magnetic field strength acting upon the material.

By using different material compositions the various characteristics can be adjusted with regards to the magnetic features. For example, the hysteresis, the form of the hysteresis loop, and the maximum permeability can be influenced thereby.

Particularly beneficial for the sensor according to the invention is the use of materials showing high magnetic permeability and low coercive field strength. This particularly applies to material compositions showing the effect called in literature "MI" (magneto-inductive) and primarily "GMI" (Giant Magneto-impedance).

The GMI-effect exclusively changes the alternating current-resistance (the impedance Z) of a magnetic material. When an amorphous or nano-crystalline micro-wire is supplied with high-frequency alternating current the alternating current flows due to the skin-effect primarily in a thin layer underneath the surface of the wire. The thickness of this layer is described by the skin-depth:

$$\delta = \sqrt{\frac{2}{\omega \cdot \sigma \cdot \mu_0 \cdot \mu_r}}$$

with $\omega$: Circuit frequency of the alternating current
$\sigma$: Conductivity
$\mu_r$: relative permeability If at the location of the wire an external magnetic field is applied, the relative permeability of the wire changes, by the permeability reducing with an increasing field. This way the skin-depth increases, which leads to the current also flowing in the lower layers underneath the wire surface. Thus, the effective wire cross-section increases, resulting in the resistance and/or the impedance Z reducing.

The size of the GMI-effect is measured in the relative change of impedance $$\frac{\Delta Z}{Z} = \frac{Z(H) - Z(H_s)}{Z(H_s)}$$

with Z(H) representing the impedance in the magnetic field H and $Z(H_s)$ the impedance in the saturation field strength $H_s$. The relative change is particularly strong in thin films or wires, because the skin-depth here shows a relative large portion in reference to the overall thickness or diameter. This relative change can assume very high values, allowing to produce very sensitive magnetic field sensors.

This effect can be observed in tapes, films, or micro-wires made from amorphous and nano-crystalline ferromagnetic materials at frequencies from 0.1 MHz to 30 MHz and has been described in numerous publications.

In prior art sensors and systems are used based on the micro-wire with magneto-inductive effects (MI) in security systems to protect an object carrying a pre-determined code-pattern, (e.g., U.S. Pat. No. 5,801,630; U.S. Pat. No. 5,583,333, DE 60003067 T2).

The present invention claims a method and a device for operating a magnetic field-sensitive position sensor, in which contrary to sensors of prior art by way of using mobile magnets or electro-magnets a relatively large measuring range is achieved as well as a high resolution with simultaneously good linearity.

Additionally the solution according to the invention shows a low structural height, weight, and a low price. By these features a very wide range of applications develops for the position measurement, e.g., in washing machines, compressors, and clutch paths.

BRIEF DESCRIPTION OF THE DRAWINGS

There are various options to embody and further develop the teaching of the present invention in an advantageous fashion. For this purpose, reference is made on the one hand to the claims dependent on claims 1 and 12 and on the other hand to the following explanation of a preferred exemplary embodiment of the invention, using the drawing. In connection with the explanation of the preferred exemplary embodiment of the invention, based on the drawing, here generally preferred embodiments and further developments of the teaching are explained as well. The drawing shows FIG. 1a in a schematic view an exemplary embodiment of a sensor according to the invention comprising an oblong, soft-magnetic material, FIG. 1b in a schematic view another exemplary embodiment of a sensor according to the invention, whereby here a base element can be applied and contacted directly on the circuit boards, FIG. 2 in a schematic view, another exemplary embodiment of a sensor according to the invention, whereby here a magnet being arranged in various orientations at the measuring object in reference to the base element, FIG. 3 in a diagram the inductivity and phase in reference to the field strength in the axial direction for soft-magnetic materials, FIG. 4 in a diagram the inductivity and phase in reference to the magnetic position, with a linear connection existing here between the magnetic distance and the permeability, FIG. 5 in a diagram the interference of the function μ(H) of the permeability of a soft-magnetic material and H(x) of the distance relationship of the magnetic field of a permanent magnet, FIG. 6 in a schematic view a testing device comprising two test coils, which are wound onto a tube, which in turn is pushed over the base element, FIG. 7 in a schematic view the operating range of a sensor according to the invention, with here the connection being shown between μ and H, FIG. 8a in a schematic view the embodiment of a base element as a conductor loop, FIG. 8b in a schematic view an exemplary embodiment of a soft-magnetic element according to the invention, installed in a tube, e.g., for a double-clutch, FIG. 9 in a schematic view another exemplary embodiment of a soft-magnetic element in a meandering shape or as a wound coil, FIG. 10 in a schematic arrangement a two-dimensionally designed base element for detecting the motion in one level, FIG. 11 in a schematic view a serial arrangement of base elements, according to which several base elements are—serially—linked, FIG. 12a in a schematic arrangement a parallel arrangement, with here several base elements being arranged side-by-side, namely in order to form an incremental sensor, and FIG. 12b in a schematic arrangement another variant of a parallel arrangement of the base elements, with here switching can occur between several side-by-side arranged base elements (multiplexer).

DETAILED DESCRIPTION

The sensor according to the invention may comprise an oblong, soft-magnetic material connected to electronics and flown-through by alternating current. A magnet is allocated to the measuring object, which magnet changes the permeability in the soft-magnetic material depending on the position of the measuring object in reference to the sensor (see FIGS. 1a, 1b).

By changing the permeability, the complex impedance of the circuit changes due to the GMI-effect, which is formed by the soft-magnetic material. In the following, the soft-magnetic material is called the base element, for reasons of simplification. It is beneficial to evaluate the relative change in impedance.

The evaluation of the impedance using methods of prior art makes it possible to therefore determine the position of the measuring object in reference to the sensor. For example, the impedance can be measured by detecting the voltage drop over the wire, from which then conclusions can be drawn regarding the strength of the external magnetic field and thus the distance of the measuring object.

$$\frac{\Delta U}{U}$$

However, the inductivity of the base element could also be assessed. Then, the relative change of the inductivity serves as the measuring signal.

$$\frac{\Delta L}{L} = \frac{L(H) - L(H_s)}{L(H_s)}$$

with L(H) being the inductivity at the magnetic field H and L(H$_s$) the inductivity at the saturation field strength H$_s$. The inductivity L(H) is dependent on the magnetic field H at the location of the sensor, which in turn is dependent on the distance and/or the position of the measuring object. Thus, the position of the measuring object can be determined from measuring the inductivity L. The inductivity can be detected from a flat coil or a wound coil, for example, or using the reaction upon an external field using additional field sensors, e.g., Hall-sensors, AMR, GMR, XMR.

Figure 1A:
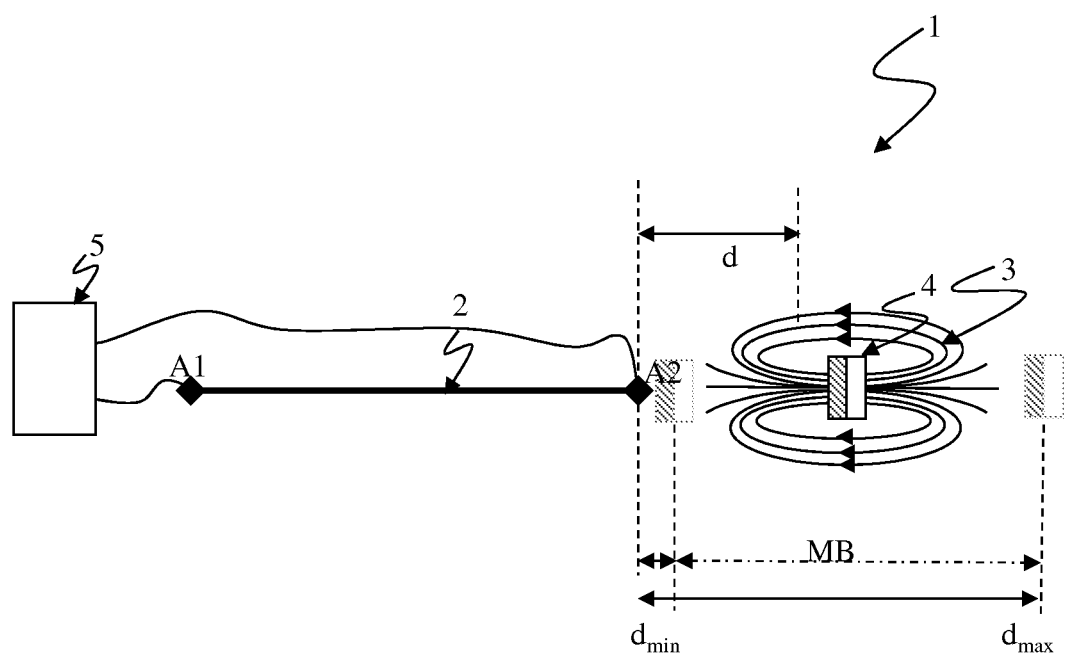
Figure 1B:
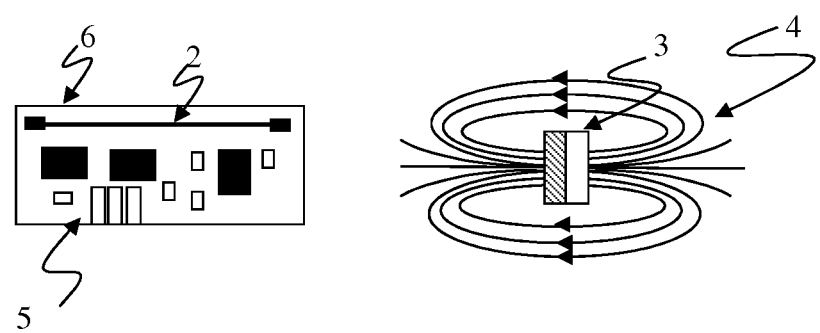

FIGS. 1a and 1b show concretely a soft-magnetic material serving as the base element 2, namely according to FIG. 1a in the sense of an oblong element 2. Furthermore, FIG. 1a shows, in addition to the sensor arrangement 1, the measuring object 3, the permanent magnet 4, and the evaluation electronics/measuring bridge 5.

According to FIG. 1b the base element 2 shows a relatively large linear measuring range and, if applicable, can be directly applied on circuit boards and here contacted. FIG. 1b shows, in addition to the base element 2, the measuring object 3, the permanent magnet 4, the evaluation electronics/measuring bridge 5, and the circuit board 6, equipped with electronics and the base element 2

Figure 2:
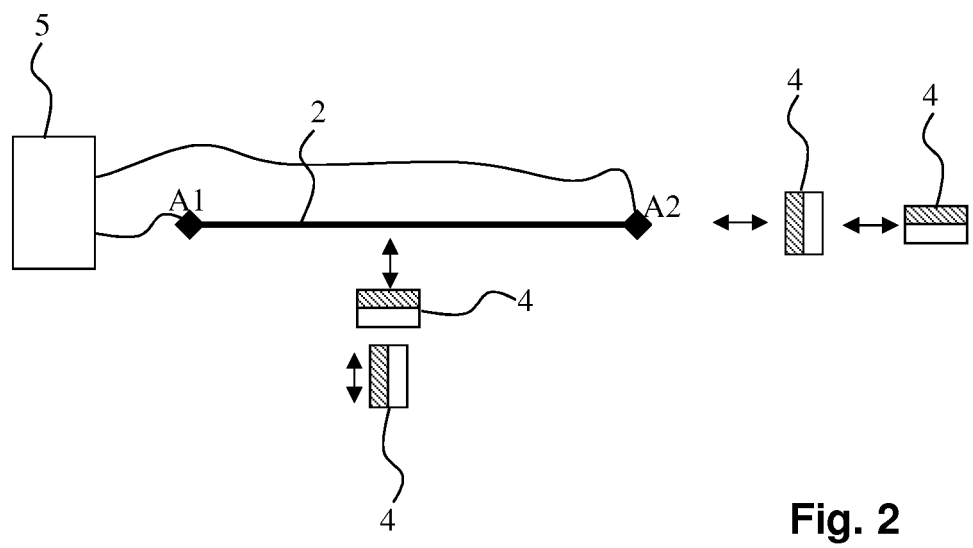

According to the illustration in FIG. 2 the magnet 4 can be arranged at the measuring object in different orientations in reference to the base element 2. Depending on the requirements of the measuring task the magnet 4 may be arranged such that it approaches the base element 2 at its face or laterally in reference thereto. The orientation of the magnet 4 can here be selected such that the desired signal stroke in the base element 2 is yielded, depending on the measuring range. Here, it is not required for the magnet 4 to be connected to the measuring object. Rather, the magnet 4 may also be arranged separated from the measuring object, for example at the sensor. It only needs to be ensured that by the measuring object the field distribution of the magnet 4 is changed at the location of the base element 2. For this purpose, it is required that the measuring object shows ferromagnetic features.

The alternating current flowing through the base element can be generated sinusoidal using suitable sinus oscillators. However, other forms of power supply are also possible to the base element, e. g. using square pulse or triangular pulse.

Here, it is only decisive that a time-dependent change of the current occurs, so that the GMI-effect develops in the base element. Here it is beneficial for the frequency of the alternating current to range from 0.1 ... 40 MHz.

Figure 3:
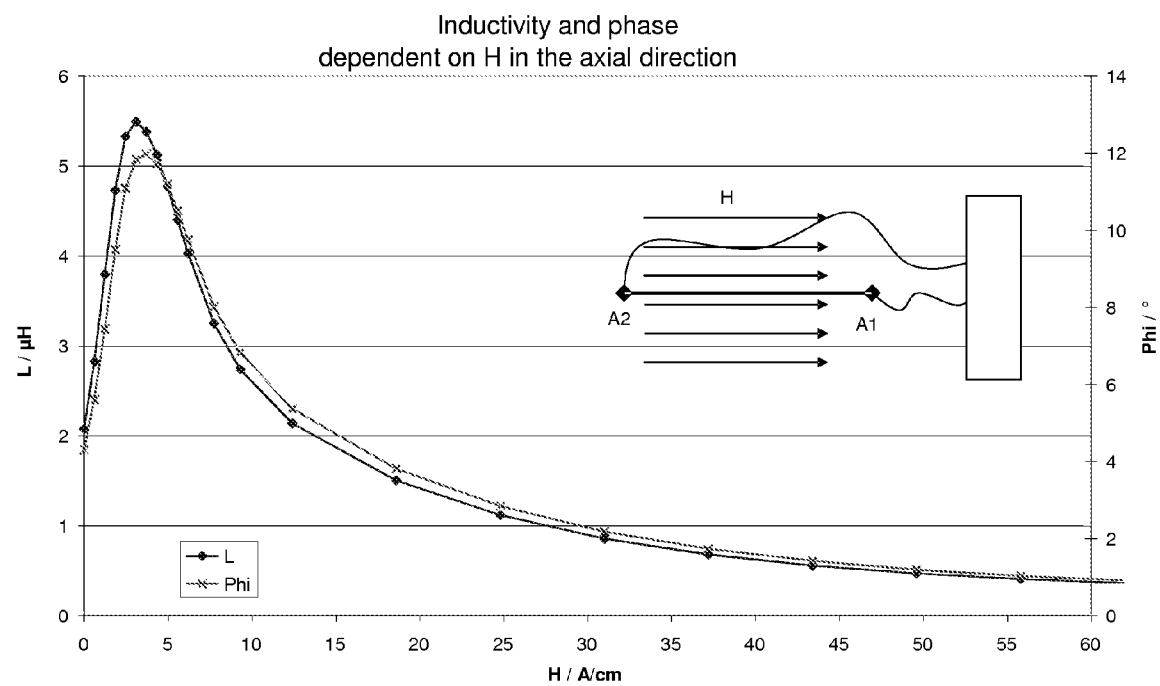

FIG. 3 shows the measured inductivity and phase in reference to an external magnetic field H. The magnetic field was generated by a Helmholtz-coil and is homogenous at the location of the base element and aligned in the longitudinal direction of the base element. The inductivity was measured with a measuring bridge at a frequency of 1 MHz.

For soft-magnetic materials the magnetic permeability shows a characteristic form, depending on the magnetic field strength H. The permeability can be determined by measuring the inductivity L, which is shown in FIG. 3. Magnetic field-sensitive sensors of prior art used for measuring field strength generally use the rising flank of the μ(H)-curve. The reason is that such sensors are primarily intended for measuring small magnetic fields, e. g. the geomagnetic field or the magnetic field on magnetic data carriers (hard drives).

Figure 4:
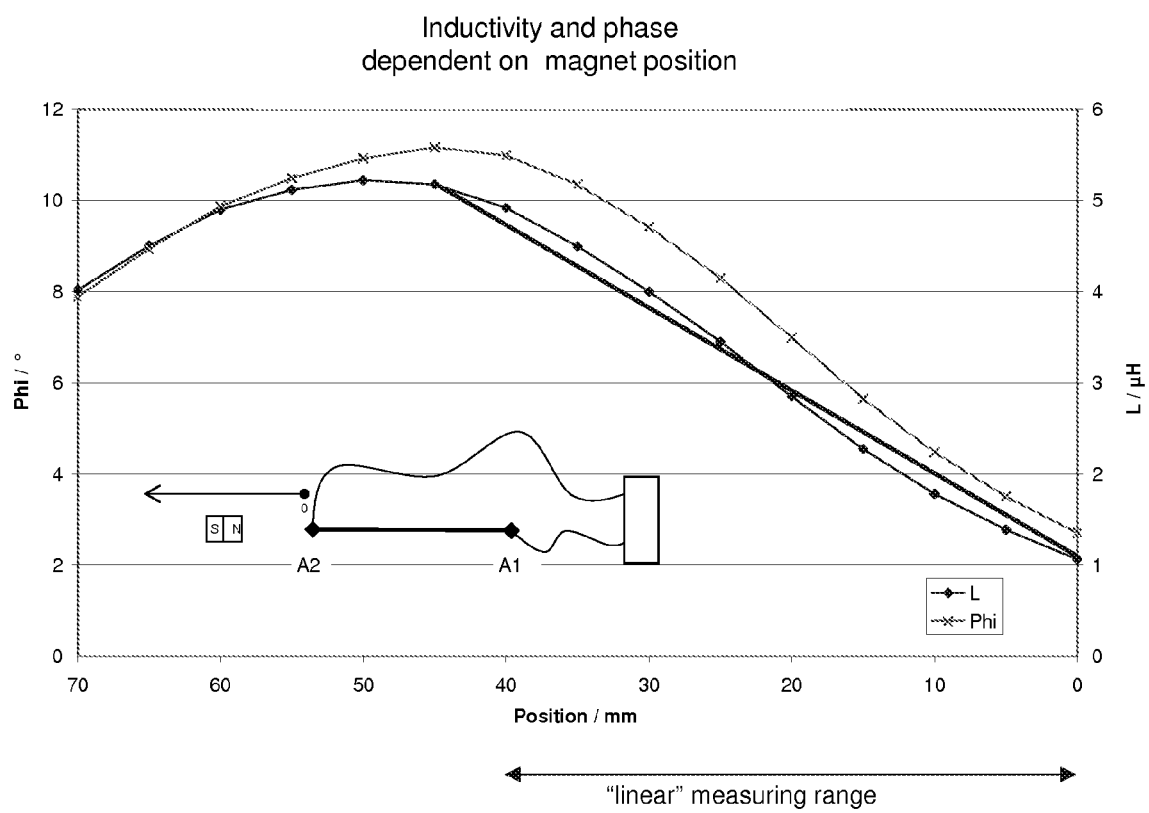

Furthermore, according to the invention it has been recognized that the declining flank is more beneficial for a position measurement, because a clearly larger measuring range can be achieved (with regards to position/distance measurement from a magnet). As shown in FIG. 4, a linear connection can be achieved between the magnet distance and the permeability. Additionally, FIG. 4 clearly shows that the connection between μ and H is non-linear to a large extent. As already mentioned, the magnetic field strength H of a magnet also decreases non-linearly with increasing distance from the surface of the magnet.

FIG. 4 shows concretely the real measured inductivity of a short wire section (50 mm) and the measured approximated linear range of the measurement between 0 mm magnet distance and approx. 45 mm magnet distance.

When increasing the magnet distance and thus when operating the base element outside the operating range the field generated by the permanent magnet further decreases and after another increase leads to the above-described reduction of the magnetic permeability and thus also to a reduction of the inductivity measured. The measurement via the soft-magnetic wire is to be interpreted as a folding of the idealized parameter in a point on a μ(H)-curve with the location of the magnet. Taking the inductivity values from the parameter shown in FIG. 4 of the reducing flank and comparing them with the measurements in the homogenous magnetic field discernible from FIG. 3 here the relevant operating range according to the invention can be easily reconstructed.

Figure 5:
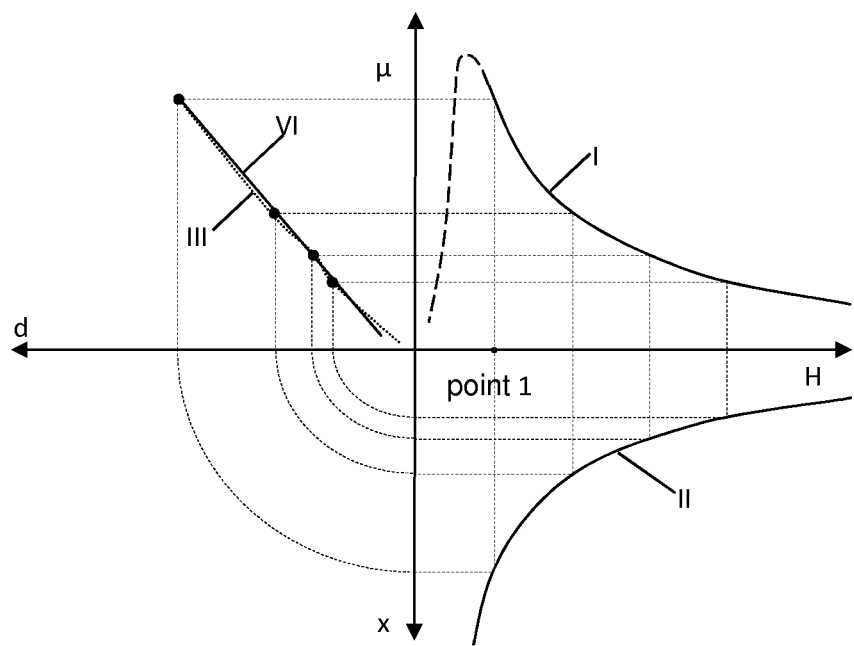

FIG. 5 shows in general the interference of the functions μ(H) of the permeability of a soft-magnetic material and H(x) of the distance-reference of the magnetic field of a permanent magnet.

The two non-linear functions are overlapping in the sensor, as discernible for example in FIG. 5. For example, there is the option to develop a sensor, with its starting signal in a first approximation being linear depending on the magnet position, without additional linearization steps need to be considered. The sensitivity (=increase of the parameter) and connected thereto the resolution is almost constant over the measuring range. This offers an advantages in reference to conventional magnetic position sensors. Based on the non-linear connection between the distance and permeability in partial sections of the parameter this requires increased amplification, by which the noise is amplified as well and the resolution is reduced.

According to the illustration in FIG. 5 the linearization can be reproduced. Concretely it is shown here:

Sector I: dropping flank of the μ(H)-curve

Sector II: dependency of the field strength ($H_=$) of a permanent magnet from the distance to the surface of the magnet Sector III: dependency μ(d)—dependency of the magnetic permeability from the distance d of the magnet Sector IV: linearly interpolated dependency μ(d).

From FIG. 5 a relatively linear connection results between the magnet position and the magnetic permeability.

The inductivity is equivalent to the permeability of the base element and shows the known curve progression for soft-magnetic materials. This is equivalent to an idealized illustration with a homogenous magnetic field at each position of the base element. However, in reality the magnetic field will not be homogenous along the base element according to FIG. 5, because the real field of a (permanent) magnet depends on the distance from said magnet. This idealized parameter therefor applies only for sectionally, infinitesimally short sections of the base element. Overall, for the inductivity of the base element in the inhomogenous field a similar curve results, which in principle is equivalent to the folding of the individual functions along the axis of the base element.

In order to ensure that the operating range of a sensor according to the invention is adjusted to the reducing part of the parameter according to FIG. 3, the signal can be determined via a testing device at the base element. The testing device in FIG. 6 comprises two test coils (6A1 and 6A2), which are wound onto this tube (7), which is pushed over the base element. The test coils (6) are arranged next to the connectors A1 and A2 of the base element (2) in the points 1 and 2. In order to exclude the measurement of edge effects the two coils (6) are shifted by the distance h, for example by approx. 2-3 mm, in reference to the connectors A1 and A2.

Figure 7:
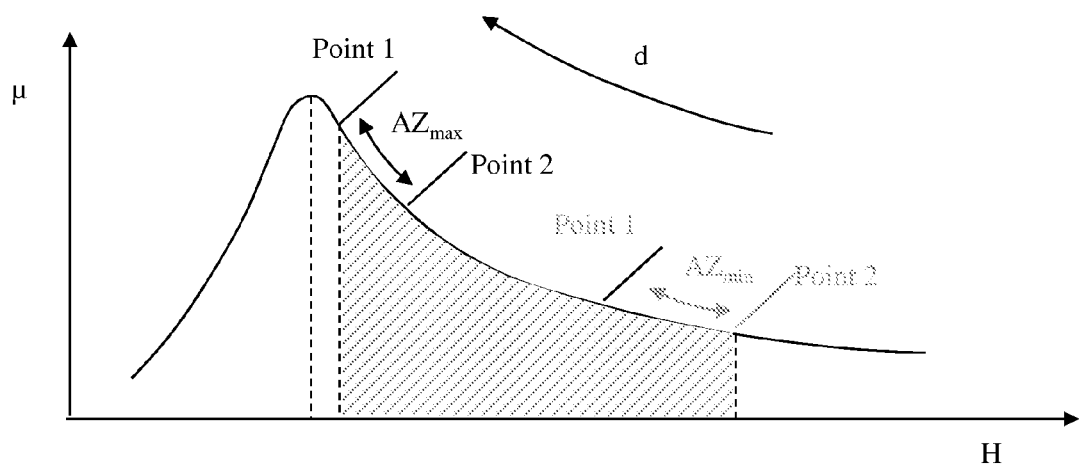

FIG. 7 shows the adjustment of the operating range of the sensor.

In order to determine the operating range the measuring object (3) is shifted with an increasing distance d from the connector A2 away in the axial direction of the base element (2). Firstly, the measuring object is located near the base element. The magnetic field of the permanent magnet is very high at the location of the base element. This is equivalent to the very flat part of the μ(H)-curve in FIG. 7 at very high field strength H. Here, practically no change of μ can be achieved, because the permeability of the base element has almost reached saturation.

The inductivities of the test coils (6A1 and 6A2) are detected via a measuring bridge. At a very high field strength H the measured inductivity of both test coils is low and almost identical so that this range is not suitable for distance measurements. The permanent magnet is then shifted away from the connector A2 with increasing distance axially in the longitudinal direction of the base element (2) until the impedances of the test coils 6A1 begin to change in the point 1 and of 6A2 in the point 2. This position is equivalent to the minimum distance of the magnet and thus the lower limit of the measuring range and describes the operating zone AZmin.

The permanent magnet is axially shifted further in the longitudinal direction of the element (2) until the inductivity of the test coil 6A1 measured reaches a maximum value Lmax in point 1. This range is equivalent to the very steep part of the μ(H)-curve in FIG. 7 shortly before reaching the maximum. This position is equivalent to the maximum distance of the magnet and thus the upper limit of the measuring range and describes the operating zone AZmax.

In order to ensure that the operating zone AZ is located on the declining flank of the µ(H)-curve the measuring range should be limited to 0.9 Lmax. The determination of the operating range results therefore in the permanent magnet only being intended to move within the here determined distance range on the declining flank of the µ(H)-curve.

Additionally, the alternating current flowing over the base element can also be interfered with direct current. Due to the fact that the GMI-effect is an alternating current effect the direct current is not influenced by the external magnetic field.

Using an additional feeding of the base element with direct current a signal can be generated which only reacts to changes at the base element, regardless of the position of the measuring object. For example, this may be temperature changes or electromagnetic interferences, which influence the direct current resistance of the base element. Here the influence of interferences can be detected via the supply with direct current. For example, the Ohm-direct current resistance of the base element changes with temperature. This way a temperature compensation of the sensor can be achieved very easily by measuring the direct current resistance.

In another advantageous embodiment the direct current can also be used to generate a static magnetic field, which is generated in a manner known per se along a conductor when current flows through it. This magnetic direct-current field leads to the permeability of the wire changing. This quasi leads to a magnetic pre-tension of the base element and results in a shift of the parameter. This may serve, similar to the method with the test coil, to adjust the operating range of the sensor. Contrary to the above-stated, here a pre-setting occurs without changing the distance of the permanent magnet. This way, in a simple fashion an operating range can be adjusted without it being necessary to change the permanent magnet itself or its position. Accordingly it is also possible, with predetermined distances, e.g., defined by the predetermined optional motions of the measuring object and without the magnet needing to be adjusted in its orientation or field strength, to adjust the operating range such that the sensor operates in the optimal range of the declining flank.

The direct current flowing through the wire can be used advantageously to adjust the operating point on the parameter. This way it is possible to measure small fields, such as in magnetic field sensors, or large fields, such as in position sensors. Consequently the sensor can be quasi "pre-stressed". By embossing the direct current, depending on the direction of the current flow, a directional dependency can also be achieved. Here, the magnetic field generated by direct current defines a direction, because the magnetic field extends annularly along the wire. In certain applications the current flowing through the wire can replace an additional compensation coil, which had to be wound about the wire.

The measuring of the inductivity of the base element can also occur, as already described, via one or more separate coils. Here, the coil can also be used to generate a magnetic field at the location of the base element, which is independent from the position of the external magnetic field of the permanent magnet. When direct current flows through the coil a static magnetic field is generated thereby in the base element. This way, additionally a pre-stressing of the base element can occur. The effects that can be yielded are here equivalent to the above-described method of supplying direct current to the base element.

The embodiment of the sensor according to the invention via glass-insulated micro-wires is also particularly beneficial because these wires show very high temperature resistance. Conventional wires show an insulation made from polyurethane, polyamide, or polyimide, for example. These insulating materials are limited with regards to their temperature resistance, though. Wires insulated with polyimide can be used maximally up to 250° C., for example. By the use of a glass insulation, which in the above-mentioned micro-wires can be applied, for example automatically due to Taylor-Ulitovski processes as early as during their production, sensors can be produced with a considerably higher temperature resistance.

In a particularly simple and cost-effective variant the embodiment of the sensor arrangement can be applied directly onto a suitable substrate, such as a circuit board or a ceramic substrate (FIG. 1a). The base element can be contacted with variants known, such as bonding, welding, or soldering. Depending on the length of the base element it is beneficial to fix it between the contact points, for example by way of adhesion. The electronics can be applied on the same substrate. This is advantageous in that firstly a particularly compact design is yielded, and secondly very short line lengths are possible between the base element and the electronics. This is advantageous because based on the relatively high frequencies short line lengths are desired.

Figure 8A:
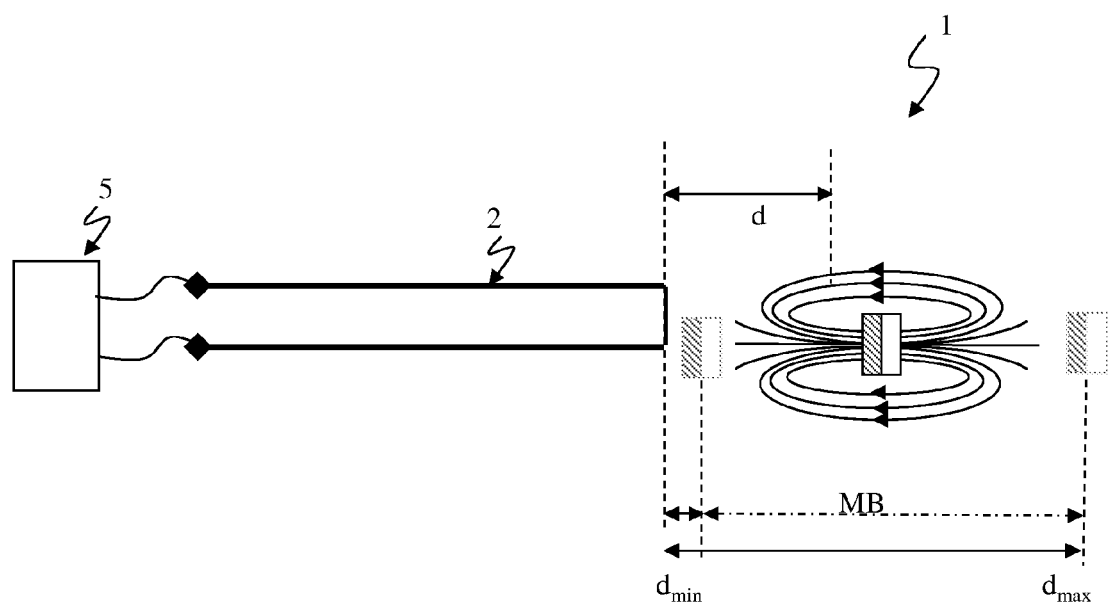

FIG. 8a shows the base element 2 in the form of a conductor loop. This base element 2 is particularly suitable for installation in tubes, according to the illustration in FIG. 8b, for example within the scope of applications in a duplex clutch.

Figure 8B:
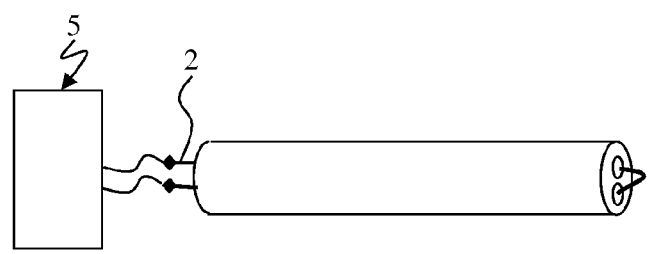

FIGS. 8a and 8b show, in addition to the sensor arrangement, the base element 2 and the assessment electronics/measuring bridge 5.

In order to avoid recoupling or increasing inductivity the soft-magnetic element may also fulfill the function of the signal recoupling. In this approach it is advantageous that only a unilateral contacting of the soft-magnetic element is required. An installation is possible in a tube, such as in duplex clutches as an example.

Figure 9:
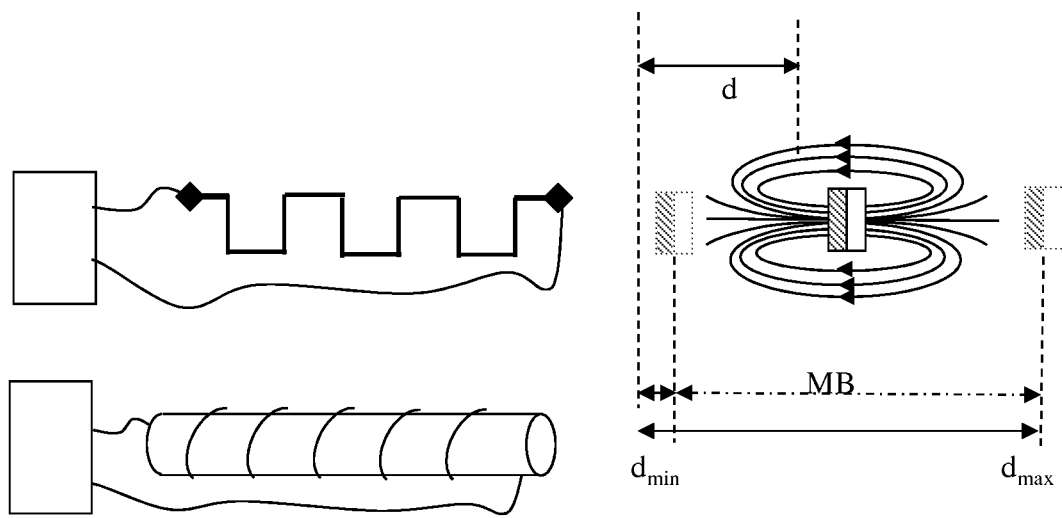

The increase of the sensitivity is also possible, for example, by embodying the base element meander-shaped or in the form of a coil (FIG. 9). By increasing the inductivity the resistance of the alternating current increases, by which it can also be operated at lower frequencies. This is advantageous in that the electronics can be embodied in a more simple design and the sensitivity of the arrangement increased.

When an oblong embodiment is impossible for reasons of contacting or the structural space available the base element may also show the form of a loop (FIG. 9). This way it is possible to implement the contacting of the base element on one side, which facilitates production and reduces the structural space required. The loop could for example also be embodied inside a ceramic tube, thus allowing to produce a temperature-stable, simple sensor with very small dimensions. By the embodiment in the form of loops simultaneously the inductivity of the arrangement is increased.

Additional arrangements are possible, in which the base element is freely formed and adjusted to particular installation conditions. For example, when using a micro-wire it can be laid in almost arbitrary shapes along trajectories describing the measuring object. For example it is possible to determine the position of the selection lever of automatic transmissions by arranging the wire along the stepped positions of the selection lever.

Figure 10:
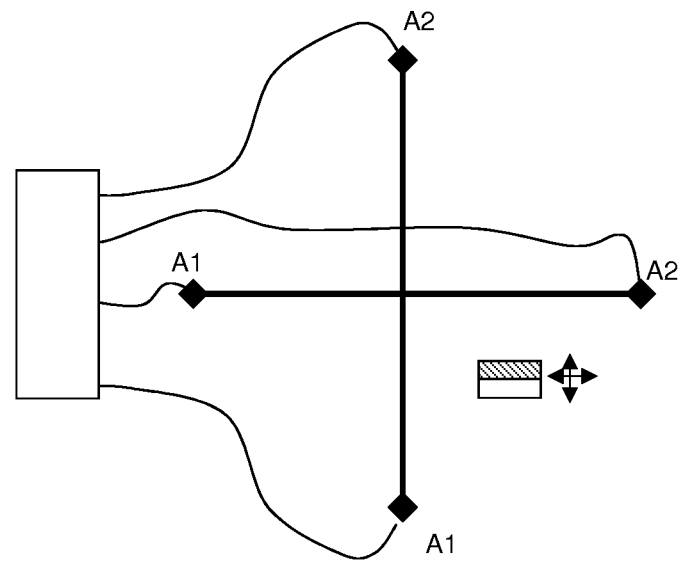

Furthermore, an arrangement of several base elements is possible in reference to each other in order to unambiguously detect positions in two or three dimensions (FIG. 10). For example for the two-dimensional detection of the movement in one level the arrangement of several base elements is beneficial on a substrate at an angle of 90° C. This way, two measuring directions are defined, allowing a two-dimensional detection of positions. This similarly applies for three dimensions, by arranging three base elements at an angle of 90° each.

Figure 11:
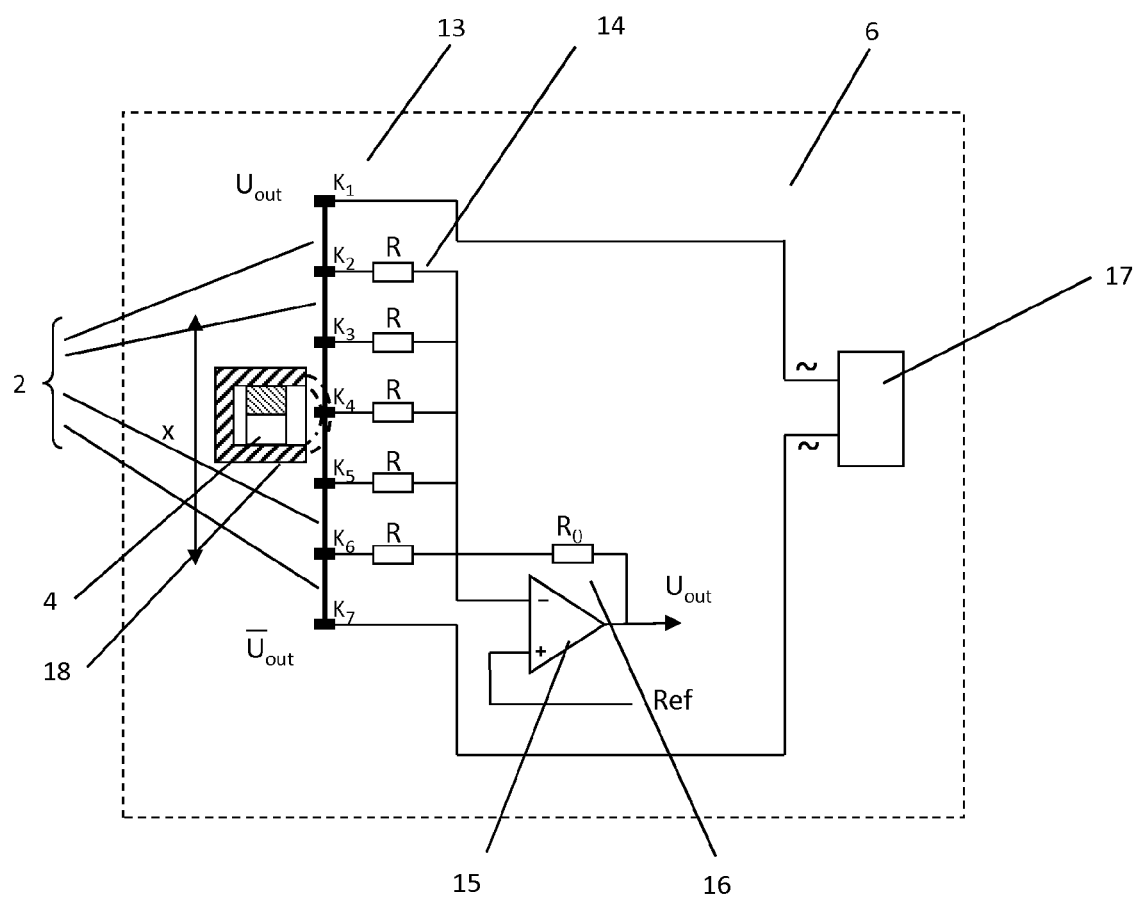

The base element offers a certain measuring range, depending on arrangement, field strength, and polarization of the magnet. In order to enlarge the measuring range of the sensor according to the invention several base elements may be arranged either serially or parallel in reference to each other, with the individual elements being equivalent to the base element shown in FIG. 1. In a serial arrangement according to FIG. 11 several base elements are serially arranged. By voltage tapping a linear signal is generated when the magnet is moved laterally along the base elements.

Several base elements are electrically connected to each other serially via contact points K1 through K7. On a carrier material, for example a circuit board or a ceramic substrate, contact points K1 through K7 are formed, which show a certain distance from each other. The measuring object comprises a permanent magnet, installed in a brace. The brace serves for field guidance so that field lines of the permanent magnet are preferably effective only in the direction of the sensor element. Here it is advantageous for the field guidance to act such that the effective field is approximately equivalent to the distance of neighboring contacts. The contacts K1 and K7 are connected to the outputs of an oscillator 6. The sensor is fed by the oscillator via contact points K1 and K7 with a high-frequency complementary alternating current. The contacts K2 . . . K6 are connected via resistors R1 . . . R6 with the inverting input of an operation amplifier 7. At the output of the operation amplifier a signal can be tapped, which is proportional to the position of the measuring object 2 along the sensor. For example, the resistors R could be laser-trimmed resistors, which allow correcting the offset and the non-linearity of the parameter. It is advantageous in this arrangement that the sensor can be implemented entirely on a circuit board with assessment electronics forming a unit. The serial connection of base elements can here not only occur by connecting separate base elements via short wire sections but here a long wire section could also be arranged between contacts K1 and K7, with the contacting at the contact points K2 . . . K6 for example occurring by way of impressing, soldering, or welding the long wire and thus dividing the long wire so that once more a serial arrangement of short base elements results.

Figure 12A:
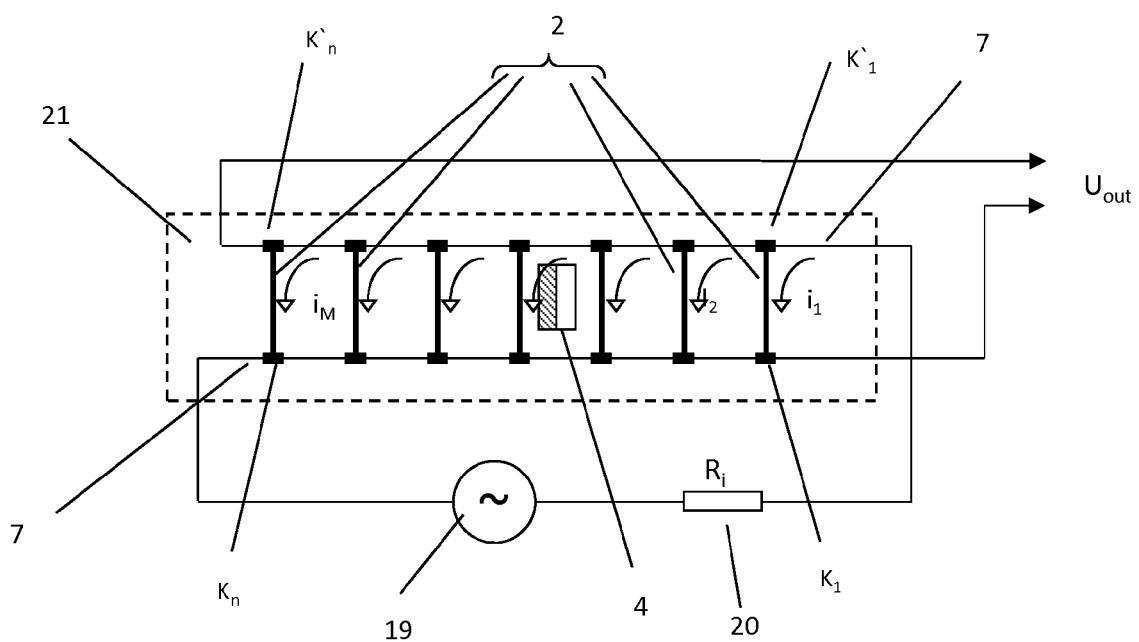

In a parallel arrangement according to FIG. 12a several base elements are arranged side-by-side, with here an incremental sensor developing. The signal is only sectionally unambiguous, similar to incremental signal emitters of prior art. In one variant of the parallel arrangement in FIG. 12b it can also be switched between several base elements located side-by-side.

Figure 12B:
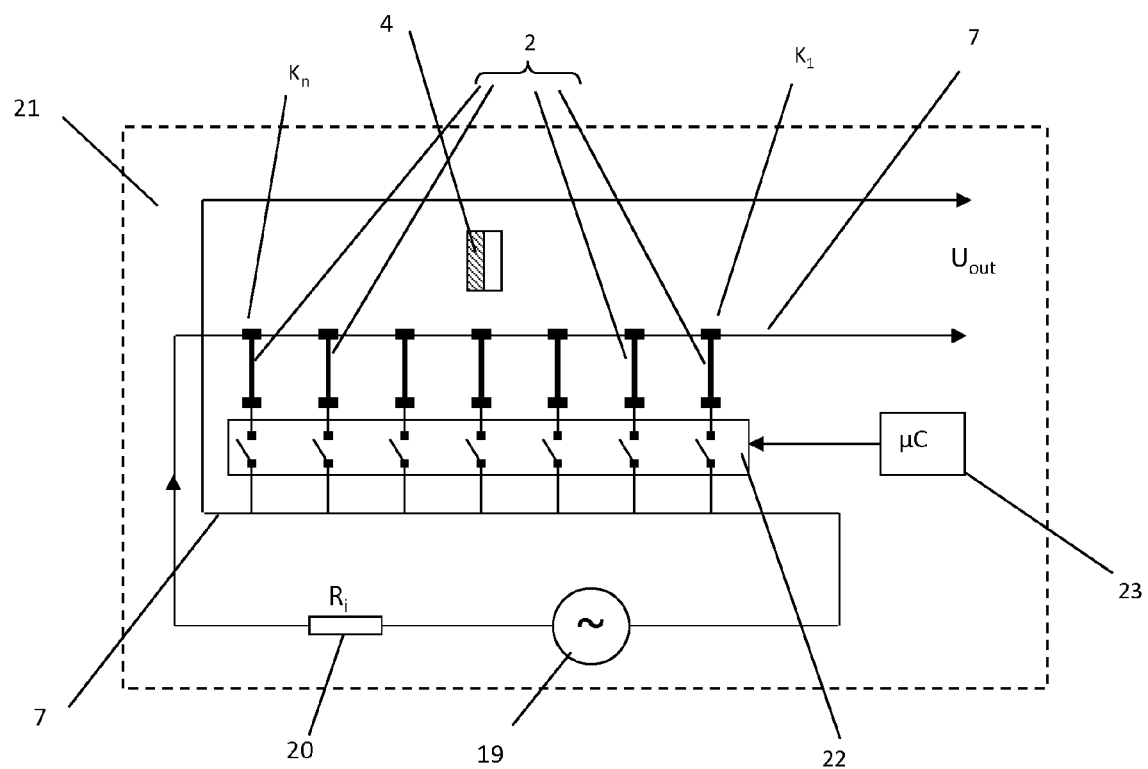

FIGS. 12a, 12b show, in addition to the base element 1, the supply line 2, the substrate 3, the magnet 4, and the alternating current source 5 with the internal resistor $R_0$.

In order to further increase the resolution of the sensor according to the invention several base elements may be arranged parallel in reference to each other. Several base elements are arranged parallel at the same distance from each other between two parallel supply lines arranged on a substrate and connected at the contact points K1 . . . Kn with the supply lines so that a periodic structure develops with a period delta. The measuring object moves parallel in reference to the substrate and perpendicular in reference to the base elements and comprises a permanent magnet. An alternating current source is connected at the start and end contacts K1' and Kn of the supply lines. The output signal can be tapped at the other ends of the supply lines K1 and Kn'. The advantage of this arrangement is the fact that the current path in the supply lines is always the same and thus the voltage drop along the measuring range is identical at each base element. Using this arrangement only one periodic output signal can be yielded, though. This way, initially no absolute measurement is possible. An absolute measurement could however be achieved by known methods, for example by a second arrangement which in reference to the first one is offset by half a period, or which is offset according to the nonius principle in reference to the first one by a greater or smaller period.

FIG. 12b shows a particular embodiment, according to which the base elements are not contacted fixed between the supply lines but according to which each base element is provided with a switch. This switch is formed by a multiplexer. Concretely, in FIG. 12b the base elements $m_1 \ldots m_n$ are shown. Furthermore, FIG. 12b shows the supply line 2, the substrate 3, the permanent magnet 4, the alternating current source 5, the multiplexer 6, and the micro-controller μC.

In order to reduce the influence of interfering fields an arrangement according to FIG. 12b is particularly advantageous. Similar to the previous figure, the base elements are not contacted fixed between the supply lines but each base element is provided with a switch. For example, these switches may be formed by a multiplexer, which is controlled by a micro-controller. As soon as the signal of a base element reaches a certain threshold the next base element is switched. The advantage of this arrangement is here that only the base element is used for measurement presently housing the magnet. Interferences acting upon the other base elements here react to the output signal to a minor extent only or not at all.

The advantages of the glass-coated micro-wires are a combination of excellent electromagnetic features (very high magnetic permeability, low coercitive field strength, and minor eddy current loss) with good mechanic stability, flexibility, and corrosion resistance while simultaneously allowing high maximum application temperatures.

The waiving of an additional measuring coil allows a simple and cost-effective production.

The linearity of the parameter already given by the measuring effect allows simple and cost-effective evaluation electronics.

The linearity of the parameter already caused in the measuring effect leads to a high base sensitivity of the sensor.

The use of micro-wires for the sensor according to the invention allows a compact sensor design with low weight.

By the very small space required the micro-wire can be integrated directly in the components without considerably influencing the mechanic features of the object. Rather, the use of the wire allows an unrestricted design.

By the composition of the micro-wire material used the resulting parameter of the sensor according to the invention can be optimized for its application.

With regards to other advantageous embodiments of the device according to the invention, in order to avoid repetitions, reference is made to the general part of the description as well as the attached claims.

Finally, it shall be explicitly pointed out that the above-described exemplary embodiments of the device according to the invention for applying the method according to the invention only serve to discuss the claimed teaching, without here limiting it to the exemplary embodiments.

LIST OF REFERENCE CHARACTERS

Figure 6:
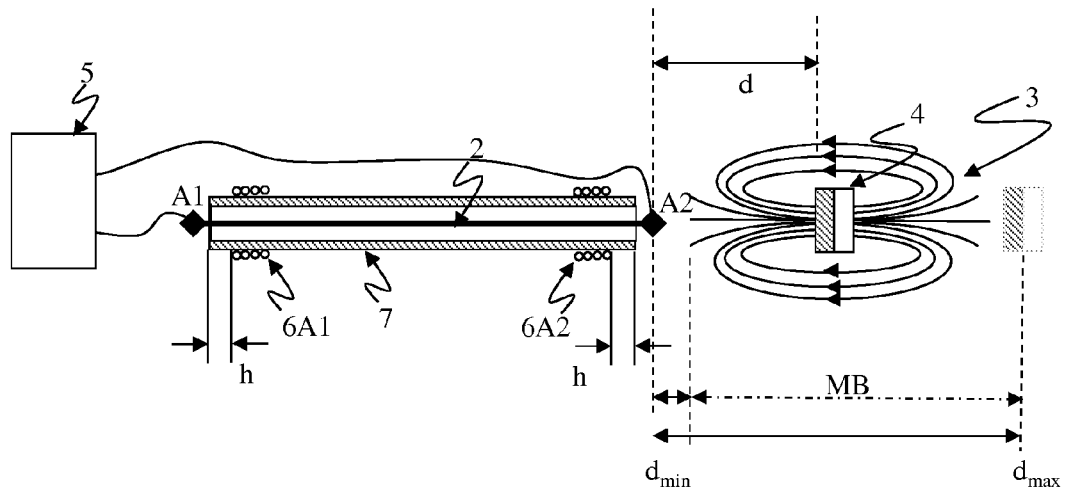

FIG. 1a
1: Sensor arrangement
2: soft-magnetic, oblong element
3: Measuring object
4: Permanent magnet
5: Evaluation electronics/measuring bridge
FIG. 1b
2: Base element
3: Measuring object
4: Permanent magnet
5: Evaluating electronics/measuring bridge
6: Circuit board with electronics and base element.
FIG. 2
2: Base element
4: Permanent magnet
5: Assessment electronics/measuring bridge
FIG. 3
Magnetic field H
magnetic field strength H
Inductivity L
FIG. 4
Field strength H
FIG. 5
Sector I: declining flank of the μ(H)-curve
Sector II: Dependency of the field strength (H_) of a permanent magnet on the distance from the surface of the magnet
Sector III: Dependency μ(d)—dependency of the magnetic permeability on the distance d from the magnet
Sector IV: linear interpolated dependency μ(d).
Functions μ(H)
H(x)
Sector I: declining flank of the μ(H)-curve
Sector II: Dependency of the field strength (H_) of a permanent magnet on the distance from the surface of the magnet x
Sector III: Dependency μ(d)—dependency of the magnetic permeability on the distance from the magnet
Sector IV: linearly interpolated dependency μ(d).
FIG. 6
two test coils, coils 6, 6A1, and 6A2
Tube 7
Connectors A1 and A2
Base element, element 2
Distance h
Measuring object 3
Operating zone AZ, AZmin, AZmax
Maximum value Lmax
FIG. 7
FIG. 8a
1: Sensor arrangement
2: Base element
5: Assessment electronics/measuring bridge.
FIG. 8b
2: Base element
5: Assessment electronics/measuring bridge
FIG. 9
FIG. 10
FIG. 11
2: Base elements
4: Permanent magnet
6: Circuit board with electronics and base element 13: Contact points K1 . . . K7
14: Resistors R
15: Operation amplifier
16: Resistor R0
17: Oscillator
18: Brace
FIG. 12a
2: Base elements
4: Permanent magnet
7: Supply line to the base elements
13: Contact points K1 . . . Kn
19: Alternating power source
20: Internal resistor Ri
21: Substrate
FIG. 12b
2: Base elements
4: Permanent magnet
7: Supply lines to the base elements
13: Contact points K1 . . . Kn
19: Alternating power source
20: Internal resistor Ri
21: Substrate
22: Multiplexer
23: Micro-controller

The invention claimed is:

1. A method for detecting a position of at least one object with an oblong, soft-magnetic element, which is connected to electronics, said method comprising the steps of:
measuring, with said electronics, the impedance of the soft-magnetic material exhibiting a giant magneto impedance (GMI)-effect,
developing a non-linear magnetic field, which due to the position of an object located in an arrangement for the soft-magnetic material, develops at the location of the soft-magnetic material,
adjusting the magnetic permeability μ of the soft-magnetic material depending on the magnetic field and thus on the position of the object, and
determining the position of the at least one object based only upon the adjustments made to the magnetic permeability μ of the soft-magnetic material,
wherein:
an operating range of the method is located on the declining flank of the permeability curve of the soft-magnetic material such that a linear connection is achieved between the position of the at least one object and the magnetic permeability μ of the soft-magnetic material, and
said measuring, developing, adjusting, and determining steps are all performed within said operating range, such that the position of the object lies within said operating range.

2. A method according to claim 1, further comprising the step of determining, via the step of adjusting the magnetic permeability, a relative position of a measuring object (3) in reference to the oblong element (2), wherein the measuring object (3) comprises at least one of a permanent magnet or an electro-magnet (4), and wherein the determining step further considers the distribution of the magnetic field along the element (2).

3. A method according to claim 1, wherein the operating range is located on the declining flank of the permeability curve of the soft-magnetic material, and an essentially linear connection is given between the position and the impedance.

4. A method according to claim 1, wherein the step of developing the magnetic field occurs via at least one of a magnet, a permanent magnet, or an electro-magnet.

5. A method according to claim 1, wherein the magnetic field is generated by direct current, which flows through the soft-magnetic element.

6. A method according to claim 1, wherein the object comprises at least one of a permanent magnet or an electro-magnet.

7. A method according to claim 1, wherein at least one of a permanent magnet or an electro-magnet is allocated fixed to the soft-magnetic material, and the object comprises a ferromagnetic material.

8. A method according to claim 1, wherein the operating zone (AZ) of the element (2) at different relative positions of the measuring object (3) in reference to the oblong element (2) is located at the declining flank of the µ(H)-curve between points 1 and 2, with on the parameter µ(H) the point 1 of the magnetic permeability next to the connection A1 and the point 2 of the magnetic permeability next to the connection A2 of the element (2) are equivalent.

9. A method according to claim 1, wherein the distribution of the magnetic field along the element (2) is measured via at least one test coil (6), with the length of the test coil (6) being considerably shorter (for USA: less than 10%) than the length of the element (2).

10. A method according to claim 1, further comprising the steps of:
preparing a testing device, which comprises an oblong element (2) made from a soft-magnetic material with two connections A1 and A2, placed on a carrier and inserted into a tube (7), and a permanent magnet (4), with two test coils (6A1 and 6A2) are wound onto this tube (7) and with the test coils (6) being arranged next to the connections A1 and A2 of the element (2); in order to exclude the measurement of edge effects the two coils (6) are shifted by the distance h in reference to the stops A1 and A2; the measuring object (3) is shifted with a distance d away from the connection A2 axially in the longitudinal direction of the element (2);
detecting the inductivities of the test coils (6A1 and 6A2) with a measuring bridge;
shifting the permanent magnet axially away from the connection A2 in the longitudinal direction of the element (2) until the impedances of the test coils 6A1 and 6A2 start to change, this position is equivalent to the minimum distance of the magnet and thus the lower limit of the measuring range and describes the operating zone $AZ_{min}$;
shifting the permanent magnet still further axially and in the longitudinal direction of the element (2) until the measured inductivity of the test coil 6A1 reaches a maximum value $L_{max}$, this position is equivalent to the maximum distance of the magnet and thus the upper limit of the measuring range and describes the operating zone $AZ_{max}$;
in order to ensure that the operating zone AZ is located on the declining flank of the µ(H)-curve, limiting the measuring range to $0.9*L_{max}$; and
after the operating zone at a certain measuring object and a certain element parameter has been determined, removing the test device such that the sensor is therefore ready for use.

11. A method according to claim 1, wherein the element is simultaneously supplied with alternating current and with direct current.

12. A device for detecting the position of objects with an oblong, soft-magnetic material, said device comprising electronics configured for determining the impedance of the soft-magnetic material via the method according to claim 1.

13. An arrangement according to claim 12, wherein the magnetic field developed occurs via at least one of a magnet, a permanent magnet, and an electro-magnet.

14. An arrangement according to claim 12, wherein the measuring object is moved in reference to the soft-magnetic material, with the magnetic field at the location of the soft-magnetic material being changed by moving the measuring object.

15. An arrangement according to claim 14, wherein the impedance changes dependent on the magnetic field and thus the distance, namely based on the movement of the measuring object.

16. An arrangement according to claim 12, wherein the operating range is located on the declining flank of the µ(H)-curve, and essentially a linear connection is given between the distance and the impedance.

17. An arrangement according to claim 12, wherein the soft-magnetic material is at least one of an amorphous material, a nano-crystalline material, and a crystalline material.

18. An arrangement according to claim 12, wherein at least one of an oblong film, a tape, and a wire section is used.

19. An arrangement according to claim 12, wherein a wire is used with a glass insulation.

20. An arrangement according to claim 12, wherein the supply occurs with at least one of alternating current and alternating voltage.

21. An arrangement according to claim 12, wherein an additional supply is provided with direct current in order to adjust the operating range.

22. An arrangement according to claim 12, wherein an additional supply of direct current is provided, in order to perform temperature measurements and temperature compensation.

23. An arrangement according to claim 12, wherein the magnet is approached from different sides.

24. An arrangement according to claim 12, wherein the magnet is approached in the direction of or parallel to the wire axis and also perpendicular in reference thereto.

25. An arrangement according to claim 12, wherein the change of the impedance is measured at various positions via a test coil.

26. An arrangement according to claim 12, wherein the test coil is supplied with direct current for adjusting the operating range.

27. An arrangement according to claim 12, wherein a conductor loop is used.

28. An arrangement according to claim 23, wherein the magnet is approached in the direction of or parallel to the wire axis and also perpendicular in reference thereto.

* * * * *